(12) United States Patent
Larson

(10) Patent No.: US 6,884,653 B2
(45) Date of Patent: Apr. 26, 2005

(54) FOLDED INTERPOSER

(75) Inventor: Charles E. Larson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/813,724

(22) Filed: Mar. 21, 2001

(65) Prior Publication Data

US 2002/0137252 A1 Sep. 26, 2002

(51) Int. Cl.$^7$ .............................................. H01L 21/58
(52) U.S. Cl. ...................................... 438/107; 438/118
(58) Field of Search ................................. 438/118, 107, 438/108, 109

(56) References Cited

U.S. PATENT DOCUMENTS

| | | | |
|---|---|---|---|
| 4,851,613 A | 7/1989 | Jacques | |
| 5,128,831 A | 7/1992 | Fox, III et al. | |
| 5,148,266 A | 9/1992 | Khandros et al. | |
| 5,252,857 A | 10/1993 | Kane et al. | |
| 5,266,912 A | 11/1993 | Kledzik | |
| 5,323,060 A | 6/1994 | Fogal et al. | |
| 5,585,675 A | 12/1996 | Knopf | |
| 5,600,183 A | 2/1997 | Gates, Jr. | |
| 5,604,377 A | 2/1997 | Palagonia | |
| 5,682,061 A | 10/1997 | Khandros et al. | |
| 5,818,107 A | 10/1998 | Pierson et al. | |
| 5,889,652 A | 3/1999 | Turturro | |
| 5,900,738 A | 5/1999 | Khandros et al. | |
| 5,994,166 A | 11/1999 | Akram et al. | |
| 6,002,590 A | 12/1999 | Farnworth et al. | |
| 6,014,320 A | 1/2000 | Mahon et al. | |
| 6,020,749 A | 2/2000 | Morris et al. | |
| 6,097,611 A | 8/2000 | Samaras et al. | |
| 6,121,676 A | 9/2000 | Solberg | |
| 6,225,688 B1 * | 5/2001 | Kim et al. ................... 257/686 |
| 6,281,577 B1 * | 8/2001 | Oppermann et al. ........ 257/724 |
| 6,300,679 B1 * | 10/2001 | Mukerji et al. ............. 257/738 |
| 6,444,921 B1 * | 9/2002 | Wang et al. ................. 174/260 |
| 6,473,308 B1 * | 10/2002 | Forthun ...................... 361/749 |
| 6,699,730 B1 | 3/2004 | Kim et al. | |
| 2004/0042190 A1 | 3/2004 | Eng et al. | |

* cited by examiner

*Primary Examiner*—George Fourson
*Assistant Examiner*—Fernando L. Toledo
(74) *Attorney, Agent, or Firm*—TraskBritt, PC

(57) ABSTRACT

A folded interposer used to achieve a high density semiconductor package is disclosed. The folded interposer is comprised of a thin, flexible material that can be folded around one or multiple semiconductor dice in a serpentine fashion. The semiconductor dice are then attached to a substrate through electrical contacts on the interposer. The folded interposer allows multiple semiconductor dice to be efficiently stacked in a high density semiconductor package by reducing the unused or waster space between stacked semiconductor dice. Vias extending through the folded interposer provide electrical communication between the semiconductor dice and the substrate. The present invention also relates to a method of packaging semiconductor dice in a high density arrangement and a method of forming the high density semiconductor package.

11 Claims, 2 Drawing Sheets

FOLDED INTERPOSER

BACKGROUND OF THE INVENTION

1. Field of the Invention

The present invention relates to a semiconductor die package. More particularly, the present invention relates to a folded interposer used to increase the semiconductor die density of a high density semiconductor package.

2. Background of Related Art

As electronic devices, such as cell phones and personal digital assistants ("PDAs"), become smaller, more portable, and more technologically advanced, there is an increasing need for high density semiconductor die packages that can provide the necessary memory for these devices. New, high density semiconductor packages must be easily and cheaply manufactured with existing equipment. In addition, the package must maintain the reliability and quality of the semiconductor die. A semiconductor die package contains many electrical circuit components that must be interconnected to form functional, integrated circuits.

Consumers want their portable devices to perform the same functions as their desktop computers, therefore requiring large amounts of memory in a much smaller electronic device. One way of accomplishing this is to increase the density of a semiconductor die package by using the package's real estate more efficiently. One advantage of high density packaging is that it decreases the length of the connections between the semiconductor die and the package, allowing the semiconductor die to respond faster. Also, reducing the length of the connections reduces the signal propagation time and makes the signal paths less vulnerable to the affects of noise.

Numerous high density semiconductor packages exist in the art. However, these packages are ill-suited for use in small, portable electronic devices because they inefficiently use their real estate, which unnecessarily adds to the overall size of the package. For instance, U.S. Pat. No. 5,128,831 issued to Fox, III et al. teaches a high density package composed of multiple submodules, each of which contains a chip bonded to a substrate. A spacer, which is at least as thick as the chip, is adhesively bonded to the peripheral upper surface of each submodule before the submodules are stacked to form the high density package. The thickness of the spacer causes a gap between each submodule. When multiple submodules are needed, the cumulative-effect of these gaps makes the package significantly larger than the size of the components used in the package.

A multichip module comprised of stacked semiconductor dice is disclosed in U.S. Pat. No. 5,323,060, issued to Fogal et al. The semiconductor dice are electrically connected to a substrate by extending long bond wires from bond pads on each semiconductor die to the substrate. In order to accommodate the loop height of the bond wires, a thick adhesive layer is applied between the semiconductor dice. The adhesive layer must be thick enough that the bond wires of the lower semiconductor die do not contact the upper semiconductor die. This multichip module is not suited for small electronic devices because the adhesive layer between the dice increases the overall thickness of the semiconductor package.

U.S. Pat. No. 5,604,377 issued to Palagonia teaches a stack of semiconductor chips designed to be lightweight and to provide better cooling, mechanical shock, and vibration protection. The chips are separated by rigid, insulating interposers formed from a rack structure that contains shelves. The shelves provide electrical insulation and mechanical protection to the chips. The rigid shelves also prevent undue movement of the chips, while the spacing between shelves allows for adequate heat dissipation. Since the shelves are rigid and provide space between the chips, the packaging scheme is not suited for use in small electronic devices.

U.S. Pat. No. 5,818,107 issued to Pierson et al. teaches an integrated circuit package that utilized metallization features, located at opposite edges of each chip, to attach a stack of chips to a substrate. The chips are bonded together through their metallization features to form a chip stack, which is then bonded to the substrate. The thickness of the metallization features, in addition to the bonding material used, provides a "stand off" or separation between chips. This separation adds to the overall thickness of the integrated circuit package, making it incompatible for use in electronic devices that require small semiconductor packages.

In U.S. Pat. No. 5,994,166 issued to Akram et al. a dense semiconductor package comprising multiple substrates with attached flip-chips is disclosed. The substrates are stacked on top of one another. Column-like connections positioned between the stacked substrates provide electrical communication. The electrical connections must be of sufficient height to provide enough clearance between substrates to mount components and also must be of sufficient strength to provide support between the substrates. Since the column-like connections cause unused space between the substrates, this semiconductor package is incompatible with electronic devices that require small semiconductor packages.

While numerous high density semiconductor packages exist, they share a common disadvantage in that they inefficiently use the space of the semiconductor package. The unused or wasted space may be the result of thick adhesive layers between semiconductor dice or may be caused by rigid interposers or other spacers. Small electronic devices, such as cell phones and PDAs, have very limited space and cannot afford to waste any of this space. Reducing the wasted or unused space in a semiconductor die package is essential because large packages occupy too much of this limited space. It would be preferable to reduce the unused or wasted space in a stack of semiconductor dice by more closely spacing the semiconductor dice. It would be more preferable for the semiconductor dice to be spaced substantially one on top of another. It would be most preferable for the overall size of a high density semiconductor package to be caused only by the thickness of the semiconductor die and a substrate, without substantial thickness coming from additional packaging or unused space.

Methods for connecting dice to a substrate are well known in the art. For example, wire bonding, tape automated bonding ("TAB"), and controlled collapse chip connection ("C4") are commonly used to physically and electrically connect semiconductor dice to a substrate. Wire bonding utilizes fine wire conductors bonded on one end to the substrate and on the other end to electrical contacts on the semiconductor die. Because wire bonding requires wires to be welded to the die, there must be adequate space to accommodate the wires. TAB utilizes patterned metal on a polymeric tape to join dice together. The joined semiconductor dice are attached to a substrate by outer lead bonding. C4, or flip-chip, bonding uses solder balls on the surface of a semiconductor die to bond the semiconductor die to a substrate.

In addition to the above-mentioned methods, the prior art also discloses using vias to attach a semiconductor die to a substrate and to provide electrical communication between the semiconductor die and substrate. The vias may be filled with conductive metal or flexible leads may be run through the vias to provide electrical communication. As mentioned above, U.S. Pat. No. 5,128,831 issued to Fox, III et al. teaches a high density package composed of multiple submodules, each of which contain a chip bonded to a substrate. Each substrate has a metallization pattern, which comprises multiple conductive traces. A spacer is adhesively bonded to the peripheral upper surface of each submodule before the submodules are stacked. Both the substrate and spacer contain vias that are coincident and substantially coaxial to each other when the package is assembled. The vias are filled with solder to electrically connect the traces of all the submodules. Similarly, U.S. Pat. No. 5,148,266 issued to Kane et al., mentioned in more detail below, uses solid vias to electrically interconnect two chips on opposite sides of a flexible carrier.

U.S. Pat. Nos. 5,252,857 and 5,682,061 issued to Khandros et al. disclose a semiconductor chip assembly containing a semiconductor chip and a substrate that are separated by an interposer. The interposer contains multiple apertures that extend from the first surface to the second surface of the interposer. Flexible leads extending through the apertures are used to connect the chip to terminals on the interposer. The interposer terminals are then connected to contact pads on the substrate. The flexible leads allow for movement of the contacts on the chip relative to the contacts on the substrate, thereby reducing the stresses caused by thermal cycling.

The semiconductor die industry has commonly used flexible components to ameliorate the problems associated with differential thermal expansion of a semiconductor die and substrate. If a die and substrate have different coefficients of thermal expansion, the heat generated by operating an electronic device causes the die and substrate to expand at different rates. When the electronic device is turned off, the semiconductor die and substrate contract at different rates. Over time, these heat cycles place a large amount of mechanical stress on the electrical contacts and solder connections between the semiconductor die and substrate. After repeated cycles, the contacts and connections may fail. The semiconductor die industry has recognized two ways around this problem. First, the mechanical stress on the electrical contacts and solder connections can be minimized by using components that have similar coefficients of thermal expansion. However, this severely limits the types of components that can be used together. A second way around this problem is to incorporate flexible components into the die package. Flexible components known in the art include interposers, circuits, circuit boards, and leads. For example, U.S. Pat. No. 4,851,613 issued to Jacques teaches a flexible circuit board that can be bent, rolled, or folded into a desired shape. The circuit board comprises a substrate, a layer of conductive material in which a circuit is formed, and an insulating layer. Surface mount devices, such as resistors, capacitors, and integrated circuits, can be mounted to the flexible circuit board. Use of the flexible circuit board allows for thermal expansion between the surface mount devices and the circuit board without cracking solder joints or breaking electrical and physical connections.

In U.S. Pat. Nos. 5,148,266 and 5,682,061 issued to Khandros et al., a semiconductor chip assembly containing an interposer and flexible leads is disclosed. The interposer separates a semiconductor chip and a substrate. The chip and substrate electrically communicate through flexible leads that run through apertures in the interposer. The leads connect the chip to terminals on the interposer, which are then connected to contact pads on the substrate. The flexible leads allow for movement of the contacts on the chip and, therefore, reduce the stresses caused by thermal cycling.

U.S. Pat. No. 5,889,652 issued to Turturro teaches an integrated circuit package comprising an integrated circuit attached to a substrate. The substrate includes two portions, a bond portion and a contact portion, separated by a flexible portion. The integrated circuit is attached to the bond portion of the substrate, while the contact portion is attached to a printed circuit board. The flexible portion of the substrate allows for relative movement between the package and the circuit board, minimizing thermal expansion stress on the solder joints.

U.S. Pat. No. 6,002,590 issued to Farnworth et al. teaches a printed circuit board that contains traces attached to a flexible trace surface. Components, such as ball grid array ("BGA") components, are attached to the traces. The flexible trace surface may be created by the top surfaces of flexible protuberances, which are formed by etching away the substrate not covered by the traces. Alternatively, the flexible trace surface may be formed by depositing a flexible layer onto the printed circuit board. The flexible trace surface allows the traces to be displaced in a direction of thermal expansion of the attached components, thus preventing cracking of solder joints between the trace and component.

U.S. Pat. No. 6,014,320 issued to Mahon et al. teaches a high density circuit module that is comprised of a flex circuit attached to a substrate. The flex circuit is attached to one side of the substrate and folded over to the other side of the substrate. The resulting module includes integrated circuits on one side of the substrate and input/output pads on the opposite side.

While the above-mentioned inventions disclose flexible components in semiconductor die packages, they only disclose attaching one semiconductor die to a substrate. Since high density semiconductor packages are necessary for new generations of electronic devices, it would be preferable to combine flexible components with semiconductor die packages that can accommodate multiple semiconductor dice.

U.S. Pat. No. 5,252,857 issued to Kane et al., discloses both of these features. A dense memory package is disclosed where two memory chips are mounted face-to-face on opposite sides of a flexible carrier or interposer. The two chips contain solder bumps that align when the chips are placed face to face. In addition, the interposer contains pads that are coated with low melting point solder. The bumps on the chips contact the pads on the interposer and are soldered together. Kane also discloses a plurality of pairs of chips mounted on opposite sides of a flexible carrier. The flexible carrier with the attached chips can be folded to connect with substrates, such as printed circuit boards. While Kane discloses a flexible carrier that can be used to connect multiple die to a printed circuit board or backplane, Kane discloses that the pairs of dice are mounted face-to-face on opposite sides of the flexible carrier.

The present invention solves the above-mentioned problems. The present invention discloses a high density semiconductor package that has reduced or eliminated the unused space between stacked semiconductor die. The resulting high density semiconductor package of the present invention is small, and is, therefore, useful in portable electronic devices such as cell phones and PDAs.

SUMMARY OF THE INVENTION

The present invention relates to a folded interposer and a high density semiconductor package that utilizes the folded interposer. The folded interposer is comprised of a thin, flexible material that can be folded around one or multiple semiconductor dice. The folded interposer allows multiple semiconductor dice to be efficiently stacked in a high density semiconductor package by reducing the unused or wasted space between stacked semiconductor dice. The present invention also relates to a method of packaging semiconductor dice in a high density arrangement and a method of forming the high density semiconductor die package. Finally, the present invention relates to a computer system that incorporates the folded interposer in a high density semiconductor die package.

BRIEF DESCRIPTION OF THE DRAWINGS

While the specification concludes with claims particularly pointing out and distinctly claiming the present invention, the advantages of the invention can be more readily ascertained from the following detailed description of the invention when read in conjunction with the accompanying drawings in which:

DETAILED DESCRIPTION OF THE INVENTION

Figure 1:
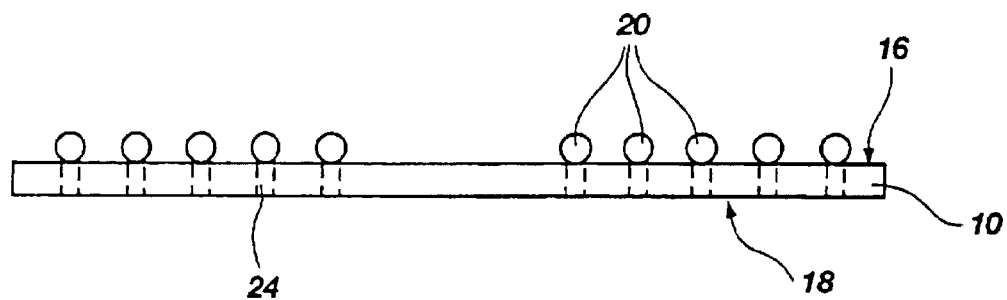
FIG. 1 is a side view of an interposer of the present invention.

Illustrated in drawing FIG. 1 is an interposer 10, which includes a first surface 16 and a second surface 18. The first surface 16 includes electrical contacts 20 for attaching the interposer 10 to a substrate (not shown), such as a printed circuit board. Vias 24 extend through the interposer 10 from the first surface 16 to the second surface 18 and are in communication with the electrical contacts 20. The folded interposer 10 is comprised of a thin, flexible material, such as an insulative polymer. The material has substantially the same width as a semiconductor die so that the material covers the surface of the semiconductor die. Preferably, the material should also be thermally conductive to allow for adequate dissipation of heat generated by the electrical circuitry.

Figure 2:
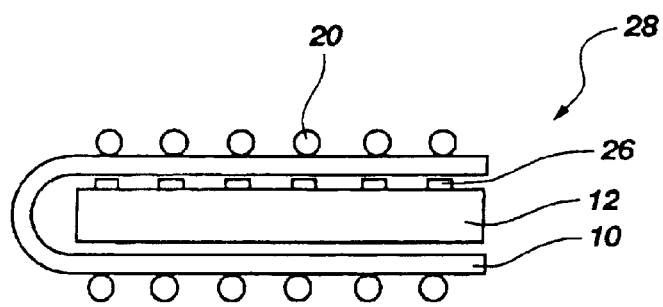
FIG. 2 is a side view of an interposer of the present invention folded around one semiconductor die.
Figure 3:
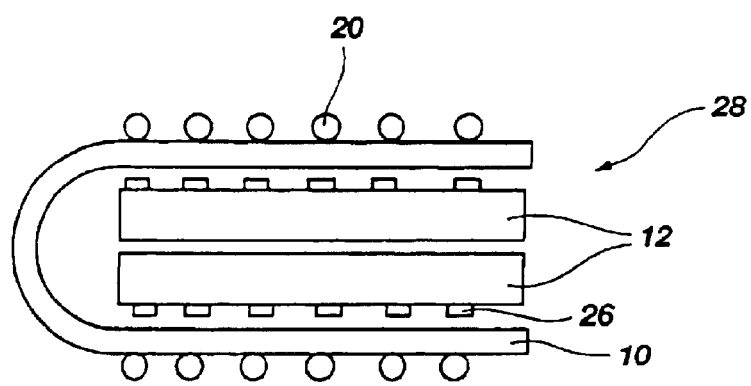
FIG. 3 is a side view of an interposer of the present invention folded around two semiconductor dice.

As illustrated in drawing FIGS. 2 and 3 the interposer 10 is flexible enough to fold around one or multiple semiconductor dice 12. Preferably, the semiconductor dice 12 are bare, unpackaged die. As is illustrated in drawing FIG. 2 (vias not shown), the interposer 10 surrounds at least three sides of one semiconductor die 12, to form an intermediate packaging structure 28. Illustrated in drawing FIG. 3 (vias not shown) is an intermediate packaging structure 28 containing multiple semiconductor dice 12, wherein the interposer 10 surrounds at least two sides of each semiconductor die.

Figure 4:
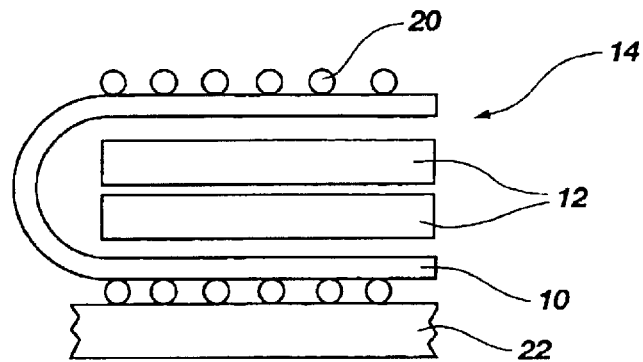
FIG. 4 is a side view of an interposer of the present invention folded around two semiconductor dice and attached to a substrate.

Methods of attaching a semiconductor die to a substrate are well known in the art. Any means known in the art for attaching the semiconductor die to the interposer may be used in the present invention. Intermediate packaging structure 28, which includes the interposer 10 and attached semiconductor die 12, is attached to a substrate to form a high density semiconductor package 14 (see FIG. 4).

The present invention also relates to a high density semiconductor die package 14 utilizing the folded interposer 10. As is best illustrated in drawing FIGS. 4 through 6, the folded interposer 10 is used to attach one or multiple semiconductor dice 12 to a substrate 22, thus forming the high density semiconductor package 14. The interposer 10, which has two surfaces, is folded around the semiconductor die 12 to form intermediate packaging structure 28. As is best illustrated in drawing FIG. 2 (vias not shown), the interposer 10 surrounds at least three sides of one semiconductor die 12 in intermediate packaging structure 28. Illustrated in drawing FIG. 3 (vias not shown) is an intermediate packaging structure 28 containing two semiconductor dice 12, wherein the interposer 10 surrounds at least two sides of each semiconductor die. Since the bond pads 26 of each semiconductor die must be in contact with vias 24, multiple semiconductor die 12 must be positioned in groups of two in a back-to-back configuration so that all semiconductor die 12 are in electrical communication with substrate 22. Intermediate packaging structure 28 is then attached to the substrate 22 through the electrical contacts 20 on the first surface 16 of the interposer. The substrate 22 may be any type of semiconductor substrate known in the art, such as a printed circuit board. The semiconductor die 12 and substrate 22 are in electrical communication through the bond pads 26 and the electrical contacts 20, which are in contact with the vias 24. The vias 24 may be filled with a conductive material to provide electrical communication between the semiconductor die 12 and substrate 22.

The high density semiconductor die package 14 accommodates more than two semiconductor die by weaving the flexible interposer 10 around groups of two semiconductor dice. Since the bond pads 26 of each die must be in contact with vias 24, the two semiconductor dice 12 must be positioned in a back-to-back configuration so that all semiconductor dice 12 are in electrical communication with substrate 22. As is illustrated in drawing FIG. 5 (bond pads and vias not shown), the interposer weaves in a serpentine fashion between groups of two semiconductor dice.

Figure 5:
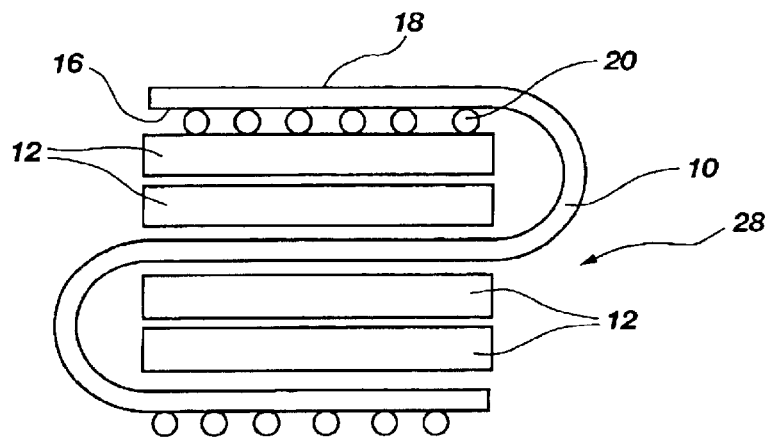
FIG. 5 is a side view of an interposer of the present invention folded in a serpentine fashion around more than two semiconductor dice.
Figure 6:
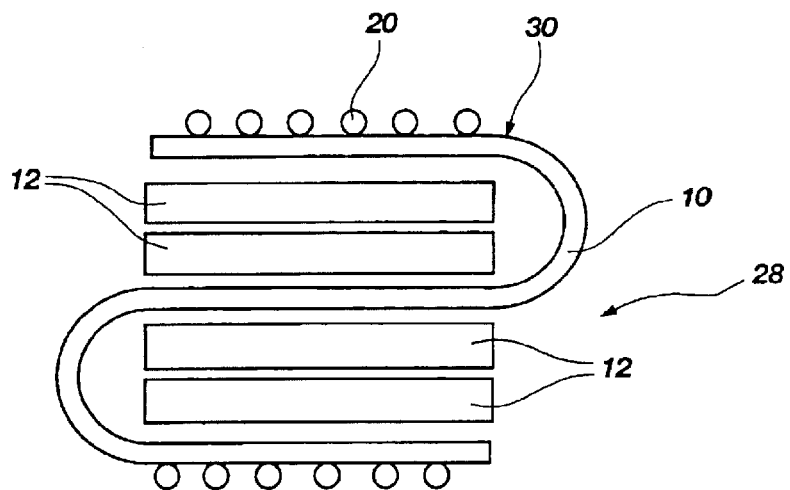
FIG. 6 is a side view of an interposer of the present invention showing electrical contacts on the top surface of the structure.

As is illustrated in drawing FIG. 5 (electrical contacts 20, vias 24, and substrate 22 not shown), the present invention also relates to a method of packaging semiconductor dice in a high density arrangement. The semiconductor dice are packaged by providing at least one semiconductor die 12, a flexible interposer 10, and a substrate 22. The interposer 10 is folded around and attached to the semiconductor dice 12. The interposer 10 has a first surface 16, a second surface 18, and vias 24 that extend through the interposer 10 from the first surface 16 to the second surface 18. The first surface 16 includes electrical contacts 20. The semiconductor dice 12 are attached to the interposer 10 through bond pads 26 on the active surface of the semiconductor die 12 to form intermediate packaging structure 28. Intermediate packaging structure 28 is then attached to substrate 22 through the electrical contacts 20 to form a high density semiconductor package 14. This attachment also results in electrical communication between the semiconductor die 12 and the substrate 22. In a high density semiconductor package 14 containing one semiconductor die 12, the interposer 10 is folded around the semiconductor die 12 so that at least three sides of the semiconductor die are surrounded, as is illustrated in drawing FIG. 2 (vias and substrate not shown). In a high density semiconductor package 15 containing two semiconductor dice 12, the interposer 10 surrounds at least two sides of each semiconductor die 12, as is illustrated in drawing FIG. 3 (vias and substrate not shown). Illustrated in drawing FIG. 5 (bond pads, vias, and substrate not shown) is that the interposer 10 weaves in a serpentine fashion between semiconductor die 12 stacked in groups of two when a high density semiconductor package 14 containing more than two semiconductor dice 12 is desired. Additionally, electrical contacts 20 may be applied to a top surface 30 of the package 14, as is shown in drawing FIG. 6 (bond pads, vias, and substrate not shown), so that the package 14 can be attached to other semiconductor devices, depending on the desired application.

The present invention also relates to a method of forming a high density semiconductor die package 14. The high density semiconductor die package 14 is formed by providing the interposer 10 and at least one semiconductor die 12. The at least one semiconductor die 12 is attached to the interposer 10 to form intermediate packaging structure 28. The intermediate packaging structure 28 is attached to substrate 22 through methods well known in the art, such as wire bonding, C4, TAB, and bonding through vias. In applications where more than two semiconductor dice are desired, the semiconductor dice 12 are attached to the interposer 10 in groups of two in a back-to-back configuration. Electrical connection between the substrate 22 and semiconductor dice 12 is established through the electrical contacts 20 and vias 24 on the interposer 10. Additionally, electrical contacts 20 may be applied to a top surface 30 of the high density semiconductor die package 14, as is shown in drawing FIG. 6 (bond pads and vias not shown), so that the high density semiconductor die package 14 can be attached to other semiconductor devices, depending on the desired application.

The present invention also relates to a computer system using the folded interposer 10 and high density semiconductor die package 14. The computer system is comprised of an input device, an output device, a processor, and a memory module. The processor is coupled to the input and output devices. The memory module is coupled to the processor. The memory module includes a module board and the high density semiconductor package 14, which are in electrical contact with each other. The high density semiconductor package 14 utilizes the folded interposer 10 as has been described above.

Although specific examples demonstrating the present invention have been described, it is to be understood that the invention defined by the appended claims is not to be limited by the particular details set forth in the above description. One of ordinary skill in the art would understand that many apparent variations are possible without departing from the scope of the appended claims. For example, varying the number of semiconductor dice in the high density semiconductor die package would be understood to be within the scope of the appended claims. In addition, varying the methods of attaching the dice to the interposer and/or the substrate and the methods of achieving electrical communication between the semiconductor dice and the substrate would be understood to be within the scope of the appended claims.

What is claimed is:

1. A method of packaging at least one semiconductor die in a high density arrangement comprising:

providing a substrate;

providing a flexible interposer including a first surface having a plurality of electrical contacts thereon for electrically connecting at least one semiconductor die to a substrate, a second surface, and a plurality of open vias extending completely through said flexible interposer from said first surface to said second surface;

providing at least one bare unpackaged semiconductor die having a plurality of bond pads on a first surface thereof;

providing a plurality of electrical contacts;

attaching said at least one semiconductor die to said flexible interposer forming an intermediate structure, said interposer being folded around said at least one bare unpackaged semiconductor die, said at least one bare unpackaged semiconductor die being in electrical communication with said substrate through a portion of the plurality of electrical contacts of said flexible interposer by at least a portion of the plurality of electrical contacts filling at least portions of the plurality of vias extending from the first surface of the interposer to the second surface of the interposer contacting a plurality of bond pads on the first surface of the at least one bare unpackaged semiconductor die; and attaching said intermediate structure to said substrate.

2. The method of claim 1, wherein each of said plurality of vias is filled with conductive metal.

3. The method of claim 1, wherein said second surface surrounds at least three sides of the at least one bare unpackaged semiconductor die around which said interposer is folded.

4. The method of claim 1, wherein said second surface of said interposer surrounds at least two sides of the at least one bare unpackaged semiconductor die around which said interposer is folded.

5. The method of claim 1, wherein each of said plurality of bond pads is in electrical communication with said plurality of electrical contacts through said plurality of vias in the flexible interposer.

6. The method of claim 1, wherein said interposer folds around more than two bare unpackaged semiconductor dice in a serpentine fashion around groups including at most two bare unpackaged semiconductor dice therein.

7. The method of claim 1, further comprising applying electrical contacts to a top surface of a high density semiconductor package to attach the at least one bare unpackaged semiconductor die to said package.

8. A method of forming a high density semiconductor package comprising:

providing at least one bare unpackaged semiconductor die having a plurality of bond pads on a surface of said at least one bare unpackaged semiconductor die;

providing an interposer including a first surface having a plurality of electrical contacts, a second surface, and a plurality of open vias extending completely through said interposer from said first surface to said second surface;

providing the plurality of electrical contacts;

attaching said at least one bare unpackaged semiconductor die to said interposer to form an intermediate packaging structure having at least a portion of the plurality of electrical contacts filling at least portions of the plurality of vias extending from the first surface of the interposer to the second surface of the interposer contacting a plurality of bond pads on the first surface of the at least one bare unpackaged semiconductor die;

providing a substrate;

attaching said substrate to said intermediate structure; and connecting said substrates and said at least one bare unpackaged semiconductor die.

9. The method of claim 8, wherein said attaching said at least one die further comprises:

attaching multiple bare unpackaged semiconductor dice in groups of two bare unpackaged semiconductor dice, said semiconductor dice having a back-to-back configuration, a back side of one bare unpackaged semiconductor die substantially contacting a back side of another bare unpackaged semiconductor die of a group.

10. The method of claim 8, wherein said plurality of electrical contacts and said plurality of bond pads provide electrical communication through said plurality of vias of the flexible interposer.

11. The method of claim 8, further comprising:

forming electrical contacts on a top surface of said package to attach semiconductor device components.

* * * * *

UNITED STATES PATENT AND TRADEMARK OFFICE
CERTIFICATE OF CORRECTION

PATENT NO.       : 6,884,653 B2                                           Page 1 of 1
APPLICATION NO.  : 09/813724
DATED            : April 26, 2005
INVENTOR(S)      : Charles E. Larson It is certified that error appears in the above-identified patent and that said Letters Patent is hereby corrected as shown below:

On the title page: line 9
Item (57) titled: ABSTRACT          change "waster" to --wasted--

| | | |
|---|---|---|
| COLUMN 2, | LINE 15, | change "utilized" to --utilizes-- |
| COLUMN 3, | LINE 19, | change "contain" to --contains-- |
| COLUMN 3, | LINE 26, | change "to" to --with-- |
| COLUMN 5, | LINE 13, | change "die" to --dice-- |
| COLUMN 5, | LINE 13, | after "backplane," and before "the" delete "Kane discloses that" |
| COLUMN 5, | LINE 20, | change "die." to --dice.-- |
| COLUMN 7, | LINE 39, | change "semiconductor package 15" to --semiconductor package 14-- |
| COLUMN 7, | LINE 46, | change "die" to --dice-- |

Signed and Sealed this

Sixth Day of November, 2007

JON W. DUDAS
*Director of the United States Patent and Trademark Office*